(12) United States Patent
Oishi et al.

(10) Patent No.: US 7,110,116 B2
(45) Date of Patent: Sep. 19, 2006

(54) ALIGNMENT APPARATUS, EXPOSURE APPARATUS USING SAME, AND METHOD OF MANUFACTURING DEVICES

(75) Inventors: Satoru Oishi, Tochigi (JP); Hideki Ina, Kanagawa (JP); Takehiko Suzuki, Saitama (JP); Koichi Sentoku, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 628 days.

(21) Appl. No.: 10/279,924

(22) Filed: Oct. 25, 2002

(65) Prior Publication Data

US 2003/0081213 A1 May 1, 2003

(30) Foreign Application Priority Data

Oct. 30, 2001 (JP) ........................... 2001-333347

(51) Int. Cl.
*G01B 21/00* (2006.01)
*G03B 27/42* (2006.01)

(52) U.S. Cl. ................... 356/401; 356/400; 355/53

(58) Field of Classification Search ......... 356/400–401; 355/53, 55; 250/548
See application file for complete search history.

(56) References Cited

U.S. PATENT DOCUMENTS

| | | | |
|---|---|---|---|
| 4,669,883 A | 6/1987 | Ina et al. | 356/401 |
| 4,834,540 A | 5/1989 | Totsuka et al. | 356/401 |
| 4,883,359 A | 11/1989 | Ina et al. | 356/401 |
| 4,886,974 A | 12/1989 | Ina | 250/561 |
| 4,901,109 A | 2/1990 | Mitome et al. | 355/68 |
| 5,133,603 A | 7/1992 | Suzuki et al. | 356/400 |
| 5,309,197 A | 5/1994 | Mori et al. | 355/53 |
| 5,323,207 A | 6/1994 | Ina | 355/53 |
| 5,625,453 A | 4/1997 | Matsumoto et al. | 356/351 |
| 5,659,384 A | 8/1997 | Ina | 355/53 |
| 5,812,271 A * | 9/1998 | Kim | 356/401 |
| 5,910,843 A | 6/1999 | Oishi | 356/375 |
| 6,124,922 A | 9/2000 | Sentoku | 355/53 |
| 6,151,120 A | 11/2000 | Matsumoto et al. | 356/399 |
| 6,154,281 A | 11/2000 | Sentoku et al. | 356/401 |
| 6,421,124 B1 | 7/2002 | Matsumoto et al. | 356/401 |
| 6,714,691 B1 * | 3/2004 | Outsuka | 382/144 |
| 6,741,328 B1 * | 5/2004 | Yonekawa et al. | 355/53 |
| 2002/0176096 A1 * | 11/2002 | Sentoku et al. | 356/620 |

* cited by examiner

Primary Examiner—Zandra V. Smith
(74) Attorney, Agent, or Firm—Fitzpatrick, Cella, Harper & Scinto

(57) ABSTRACT

An alignment apparatus for aligning a reflective reticle includes a light source for emitting alignment light, an optical alignment mark provided on the reticle, and a reference mark provided on a reticle stage that holds the reticle. A detecting unit detects the alignment light reflected from the alignment mark and the reference mark, and the reticle is aligned on the basis of the result of detection by the detection unit.

6 Claims, 10 Drawing Sheets

FLOW FOR MANUFACTURE OF SEMICONDUCTOR DEVICES

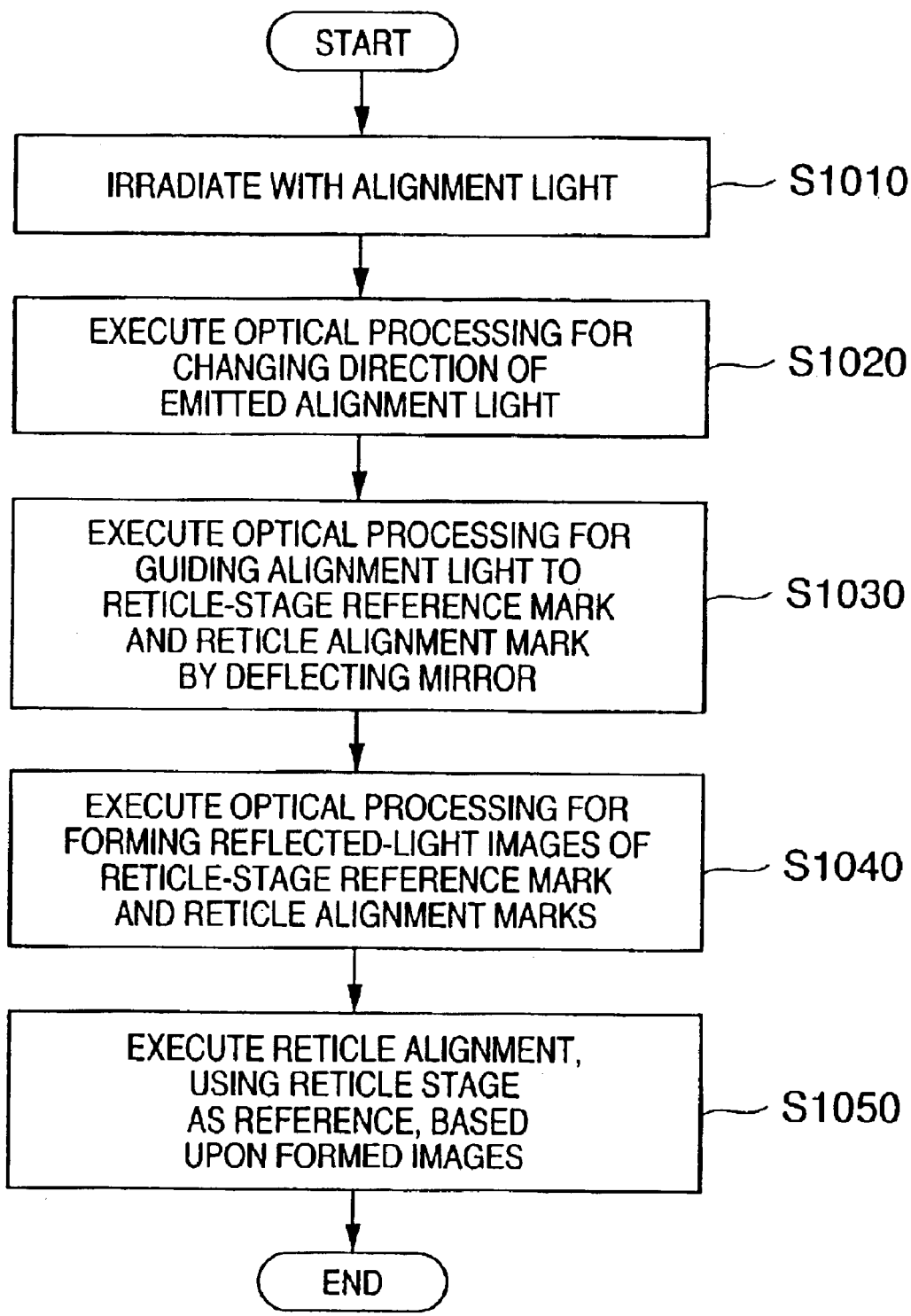

ALIGNMENT APPARATUS, EXPOSURE APPARATUS USING SAME, AND METHOD OF MANUFACTURING DEVICES

FIELD OF THE INVENTION

This invention relates to a reticle alignment method in an exposure apparatus used in an exposure process for manufacturing semiconductor integrated circuits, namely, an alignment apparatus for achieving relative alignment between a reticle and the exposure apparatus, per se, a method of controlling the alignment apparatus, an exposure apparatus for performing alignment of a reticle using this apparatus, and a method of manufacturing semiconductor devices using this exposure apparatus.

BACKGROUND OF THE INVENTION

Demagnifying projection exposure using ultraviolet light has long been performed as a lithographic method for manufacturing micro-semiconductor devices such as semiconductor memories and logic circuits. The smallest dimensions that can be transferred by demagnifying projection exposure are proportional to the wavelength of the light used in transfer and inversely proportional to the numerical aperture of the projection optics. In order to transfer microcircuit patterns, therefore, shorter wavelengths are being adopted for the light used. For example, the wavelength of ultraviolet light used has become progressively shorter, i.e., 365 nm using mercury lamp i-rays, 248 nm using a KrF excimer laser and 193 nm using an ArF excimer laser.

However, semiconductor devices are becoming smaller and smaller at a rapid pace and lithography using ultraviolet light imposes limitations on demagnifying projection exposure. Accordingly, in order to perform the lithography of very fine circuit patterns of less than 1 µm in an efficient manner, a demagnifying projection exposure apparatus using extreme ultraviolet (EUV) light having a wavelength on the order of 10 to 15 nm, which is much shorter than that of ultraviolet light, has been developed.

Because absorption of light by substances is extremely high in the EUV region, lens optics that utilize the refraction of light, as employed with visible light and ultraviolet light, are impractical and, hence, use is made of reflective optical systems in exposure apparatus that rely upon EUV light. These reflective optical systems employ a reflective reticle obtained by forming the pattern, which is to be transferred, on a mirror using an absorbing body.

A multilayer mirror and an oblique-incidence full-reflection mirror are examples of reflectance-type optical elements for constructing an exposure apparatus that relies upon EUV light. In the EUV region, the real part of the index of refraction is much smaller than unity and, as a result, total reflection occurs if use is made of oblique incidence in which the EUV light just barely impinges upon the mirror surface. Usually, a high reflectivity of twenty or thirty percent or more is obtained by oblique incidence of within several degrees measured from the surface. However, because such oblique incidence diminishes degree of freedom in terms of optical design, it is difficult to use an oblique-incidence full-reflection mirror in a projection optical system.

A multilayer mirror obtained by building up alternating layers of two types of substances having different optical constants is used as a mirror for EUV light employed at an angle of incidence close to that of direct incidence. For example, molybdenum and silicon are formed in alternating layers on the surface of a glass substrate polished to have a highly precise surface shape. The layer thicknesses of the molybdenum and silicon are, e.g., 0.2 nm and 0.5 nm, respectively, and the number of layers is 20 each. The combined thickness of two layers of the different substances is referred to as the "film cycle". In the above example, the film cycle is 0.2 nm+0.5 nm=0.7 nm.

When EUV light impinges upon such a multilayer mirror, EUV light of a specific wavelength is reflected. Only EUV light of a narrow bandwidth centered on a wavelength X that satisfies the relationship of Bragg's equation $$2 \times d \times \sin \theta = \lambda \quad (1)$$

where λ represents the wavelength of the EUV light and d the film cycle, will be reflected efficiently. The bandwidth in this case is 0.6 to 1 nm.

The reflectivity of the reflected EUV light is 0.7 at most, and the unreflected EUV light is absorbed in the multilayer films or in the substrate. Most of this energy is given off as heat.

Since a multilayer mirror exhibits more loss of light than a mirror for visible light, it is necessary to hold the number of mirrors to the minimum. In order to realize a broad exposure area using a small number of mirrors, use is made of a method (scanning exposure) in which a large area is transferred by causing a reticle and a wafer to perform scanning using fine arcuate areas (ring fields) spaced apart from the optical axis at fixed distances.

FIG. 8 is a schematic view illustrating a demagnifying projection exposure apparatus that employs EUV light according to an example of the prior art. This apparatus includes an EUV light source, an illuminating optical system, a reflecting-type reticle, a projection optical system, a reticle stage, a wafer stage, an alignment optical system and a vacuum system.

By way of example, a laser plasma light source is used as the EUV light source. Specifically, a target material placed in a vacuum vessel is irradiated with high-intensity pulsed laser light from a light source 801, a high-temperature plasma is produced and EUV light having a wavelength of, for example, 13 nm that emanates from the plasma is utilized as the EUV light source. A thin film of metal, an inert gas or a droplet is used as the target material, which is supplied by a target supply unit 802, and is fed into the vacuum vessel by means such as a gas jet. In order to increase the average intensity of the EUV light emitted, the pulsed laser should have a high repetition frequency and the apparatus should be operated at a repetition frequency of several kilohertz.

The illuminating optical system comprises a plurality of multilayer or oblique-incidence mirrors (803, 804, 805) and an optical integrator 806, etc. A condensing lens 803 constituting a first stage functions to collect EUV light that emanates from the laser plasma substantially isotropically. The optical integrator 806 functions to illuminate a reticle 814 uniformly using a prescribed numerical aperture. An aperture for limiting to a circular arc the area of the reticle surface that is illuminated is provided at a conjugate point with respect to the reticle 814 disposed in the illuminating optical system.

The projection optical system uses a plurality of mirrors (808 to 811). Though using a small number of mirrors allows EUV light to be utilized very efficiently, this makes it difficult to correct for aberration. The number of mirrors needed to correct for aberration is four to six. The shapes of the reflecting surfaces of the mirrors are convex or concave spherical or non-spherical. The numerical aperture NA is 0.1 to 0.3. To fabricate the mirror, use is made of a substrate consisting of a material, such as glass having a low coefficient of expansion or silicon carbide, that exhibits a high rigidity and hardness and a small coefficient of expansion, the substrate is formed to have a reflecting surface of a predetermined shape by grinding and polishing, and multilayer films such as molybdenum and silicon are formed on the reflecting surface. In a case wherein the angle of incidence is not constant owing to the location of the layer in the mirror surface, the wavelength of the EUV light, the reflectivity of which rises depending upon the location, shifts, if use is made of multilayer films having a fixed film cycle, as is evident from Bragg's equation cited above. Accordingly, it is required that a film-cycle distribution be provided in such a manner that EUV light of the same wavelength will be reflected efficiently at the mirror surface.

A reticle stage 812 and a wafer stage 813 have a mechanism in which scanning is performed synchronously at a speed ratio proportional to the reducing magnification. Let X represent the scanning direction in the plane of the reticle or wafer, Y the direction perpendicular to the X direction, and Z the direction perpendicular to the plane of the reticle or wafer.

The reticle 814 is held by a reticle chuck 815 on the reticle stage 812. The reticle stage 812 has a mechanism for high-speed movement in the X direction. Further, the reticle stage 812 has a fine-movement mechanism for fine movement in the X, Y and Z directions and for fine rotation about these axes, thus making it possible to position the reticle. The position and attitude of the reticle stage are measured by laser interferometers (not shown) and are controlled based upon the results of measurement.

A wafer 816 is held by a wafer chuck 817 on the wafer stage 813. Like the reticle stage, the wafer stage 813 has a mechanism for high-speed movement in the X direction. Further, the wafer stage 813 has a fine-movement mechanism for fine movement in the X, Y and Z directions and for fine rotation about these axes, thus making it possible to position the wafer. The position and attitude of the wafer stage are measured by laser interferometers (not shown) and are controlled based upon the results of measurement.

Consider an arrangement in which an alignment detection system (818, 819) is implemented by an off-axis bright-field illuminated image processing system similar to that of, e.g., an ArF exposure apparatus, and wafer alignment is carried out while a predetermined baseline amount is maintained.

Further, the focus position along the Z axis on the wafer surface is measured by a focus-position detecting optical system 820, and the position and angle of the wafer stage are controlled. During exposure, therefore, the surface of the wafer is always maintained at the position at which the image is formed by the projection optical system.

When a single scan of exposure of the wafer ends, the wafer stage is stepped in the X and Y directions to move the stage to the starting position of the next exposure scan, then the reticle stage and wafer stage are again scanned synchronously in the X direction at a speed ratio that is proportional to the reducing magnification of the projection optical system. Thus, an operation for synchronously scanning the reticle and wafer in a state in which the demagnified projection image of the reticle is formed on the wafer is repeated (by a step-and-scan operation). The transfer pattern of the reticle is thus transferred to the entire surface of the wafer.

FIG. 9 is a diagram showing an arrangement for reticle alignment according to the prior art. In the specification of this application, "reticle" and "mask" will be referred to generically as a "reticle".

Reticle alignment involves achieving relative alignment between a reticle reference mark 60, which has been positioned accurately on the apparatus proper, and a reticle alignment mark 4 situated on a reticle 1. In FIG. 9, alignment light having a wavelength different from that of the exposing light is reflected on the side of the reticle side by a prism 80 and illuminates the reticle reference mark 60 and the reticle alignment mark 4. Light from the marks has the direction of its optical path changed by a deflecting mirror 70 and is directed toward an image sensing device 10 via an optical system 40 so that the images of both the reticle reference mark 60 and reticle alignment mark 4 are formed on the image sensing device 10. Owing to the positional relationship between the images of the two marks, the amount of positional deviation with respect to the reticle 1 is calculated. Based upon the result of calculation, the reticle stage 812 is driven by a drive unit (not shown) to achieve alignment between the reticle alignment mark 4 and reticle reference mark 60. Performing this alignment completes the aligning of the reticle and exposure apparatus proper.

However, when reticle alignment in an X-ray demagnifying projection exposure apparatus (EUVL) is considered, the fact that the reticle used is a reflective reticle means that it is impossible to detect the mark images of both the reticle reference mark and reticle alignment mark simultaneously by "transmitting" the images.

Further, since the reflective reticle and multilayer mirror are optimized so as furnish a high reflectivity with EUV light, there is the possibility that a sufficient reflectivity will not be obtained for the alignment light, which is non-exposing light. In other words, in a case wherein consideration is given to so-called TTL (Through-the-Lens) alignment performed via a reflective reticle and a multilayer mirror using non-exposing light, there is the possibility that owing to alignment between the reticle alignment mark on the reflective reticle and the mark on the wafer, the image detection signal will decline because the the reticle alignment mark exhibits low reflectivity with respect to alignment light.

In the ordinary projection exposure apparatus, a method of aligning the reticle and wafer via a projection lens is referred to as TTL alignment. In an EUV exposure apparatus, however, the projection optical system is constituted not by lenses but by the multilayer-mirror optical system. It is difficult, therefore, to refer to this scheme as a TTL scheme. However, for the sake of simplifying the description, an alignment system that uses the intervention of a multilayer-mirror optical system will also be defined as being a TTL alignment scheme in this specification.

SUMMARY OF THE INVENTION

The present invention has been proposed to solve the aforementioned problems of the prior art and its feature is to provide an alignment method and an alignment apparatus through which reticle alignment can be performed accurately even with regard to a reticle of a reflecting type, and through which a TTL alignment measurement in an exposure apparatus can also be performed in accurate fashion.

Another feature of the present invention is to provide an exposure apparatus in which alignment can be executed accurately and rapidly even in a case where use is made of a reticle involving limitations with regard to use of alignment light, such as a reflecting-type reticle.

An alignment apparatus, and an exposure apparatus according to the present invention are mainly provided with the following configuration.

That is, the present invention provides an alignment apparatus for aligning a reflective reticle, having:

a light source for emitting alignment light;

an optical unit for guiding the alignment light, which has been emitted by the light source, to an alignment mark provided on the reticle and a reference mark provided on a reticle stage that holds the reticle;

detecting means for detecting the alignment light reflected from the alignment mark and the reference mark, and wherein the reticle is aligned on the basis of the result of detection by the detection means.

Furthermore, the present invention provides an exposure apparatus for exposing a substrate to a pattern of a reflective reticle, having:

a reticle stage for holding the reticle;

a substrate stage for holding the substrate;

an alignment light source for emitting alignment light having a wavelength different from that of exposure light;

an optical unit for guiding the alignment light to an alignment mark provided on the reticle and a reference mark provided on the reticle stage;

detecting means for detecting the alignment light reflected from the alignment mark and the reference mark; and means for controlling the relative positions of the reticle and the substrate on the basis of the result of detection by the detection means.

Furthermore, the present invention provides an exposure apparatus for performing exposure using exposure light, the apparatus employing a reticle holding mechanism for holding a reticle, a substrate holding mechanism for holding a substrate to be exposed, and a projection optical system for projecting a pattern of the reticle onto the substrate to thereby expose the substrate to the pattern, having:

a first position detection unit for detecting a position reference of the reticle holding mechanism;

a second position detection unit for detecting a position reference of the substrate holding mechanism; and a third position detection unit for detecting both the position reference of the reticle holding mechanism and the position reference of the substrate holding mechanism via the projection optical system, a baseline on the side of the reticle holding mechanism being found from results of detection by the first and third position detection units, a baseline on the side of the substrate holding mechanism being found from results of detection by the second and third position detection units, and relative positions of the reticle holding mechanism and the substrate holding mechanism being controlled using the first and second position detection units upon taking both of the baselines into consideration.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 10 is a flowchart showing an overview of processing illustrative of the procedure of an alignment method.

DETAILED DESCRIPTION OF THE PREFERRED EMBODIMENTS

Preferred embodiments of the present invention will now be described in detail in accordance with the accompanying drawings.

<First Embodiment>

Figure 1:
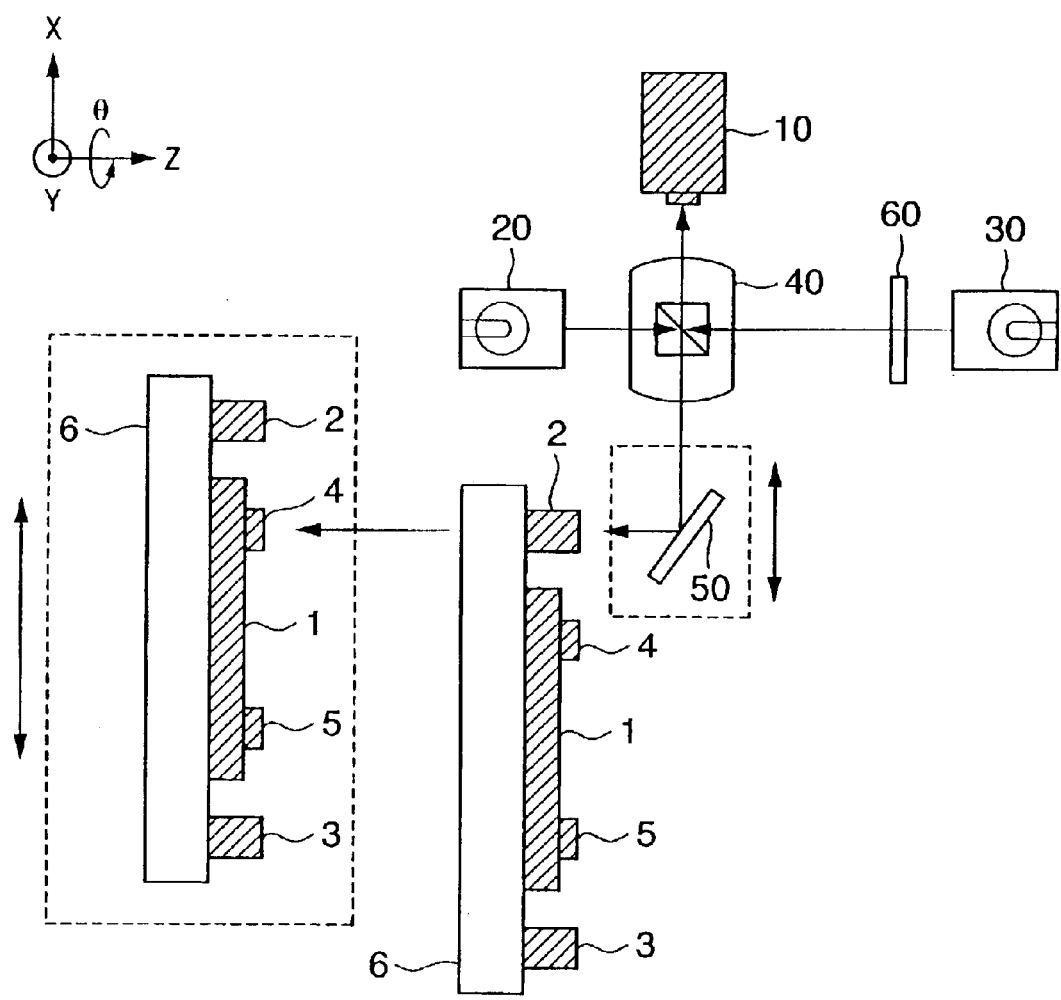
FIG. 1 is a schematic side view of an alignment apparatus and illustrates reticle alignment according to the present invention.

FIG. 1 is a diagram useful in describing a first embodiment of an alignment apparatus according to the present invention. This diagram illustrates reticle alignment in a demagnifying X-ray exposure apparatus (EUV). Reticle alignment is characterized by scanning a reticle stage 6 to detect, in the form of an image, a positional deviation between reticle-stage reference marks (2, 3) on the reticle stage 6 and reticle alignment marks (4, 5) on a reticle 1. FIG. 10 is a flowchart showing an overview of processing illustrative of the procedure of an alignment method.

The details of this processing will now be described. Alignment light having a wavelength different from that of exposing light is emitted from an illumination source 20 (step S1010). The alignment light has its direction changed by the optical system 40 (step S1020) and is guided to a deflecting mirror 50. The deflecting mirror 50 is placed in an area where it will not block the exposing light. The mirror 50 can be fixed at this position or can be moved. The alignment light that has had the direction of its optical path changed by the deflecting mirror 50 is such that its principal ray impinges vertically upon the reticle stage 6 and reticle 1 (step S1030).

Alignment light that has been reflected by the reticle-stage reference mark 2 on the reticle stage 6 is directed toward the image sensing device 10 via the deflecting mirror 50 and optical system 40 so that the image of the reticle-stage reference mark 2 is formed on the image sensing device 10.

Next, the reticle stage 6 is scanned a predetermined amount in a predetermined direction so that the images of the reticle alignment marks 4, 5 and reticle-stage reference mark 3 are formed on the image sensing device 10 (step S1040). The positional deviations of these images are then calculated (step S1050). It should be noted that the reticle-stage reference marks 2, 3 and reticle alignment marks 4, 5 are situated at the same height along the Z direction beforehand for the convenience of the arrangement. However, the defocusing characteristics of each of the mark images may be detected to detect height along the Z direction.

It should be noted that the reticle reference mark 60 has been positioned accurately on the apparatus proper and that the image of the reticle reference mark 60 is formed on the image sensing device 10 by illuminating light from another illumination source 30, thereby making it possible to measure periodically the aging of the detection optical system inclusive of the image sensing device 10.

Further, since the reticle-stage reference marks 2, 3 have been disposed on the reticle stage 6, a temporal change in traveling error of the reticle stage in the scanning direction can be observed in "reticleless" fashion (i.e., in a state in which the reticle stage is devoid of a reticle). By ascertaining such a change with the passage of time, it is possible to calibrate positioning of the stage.

Figure 2:
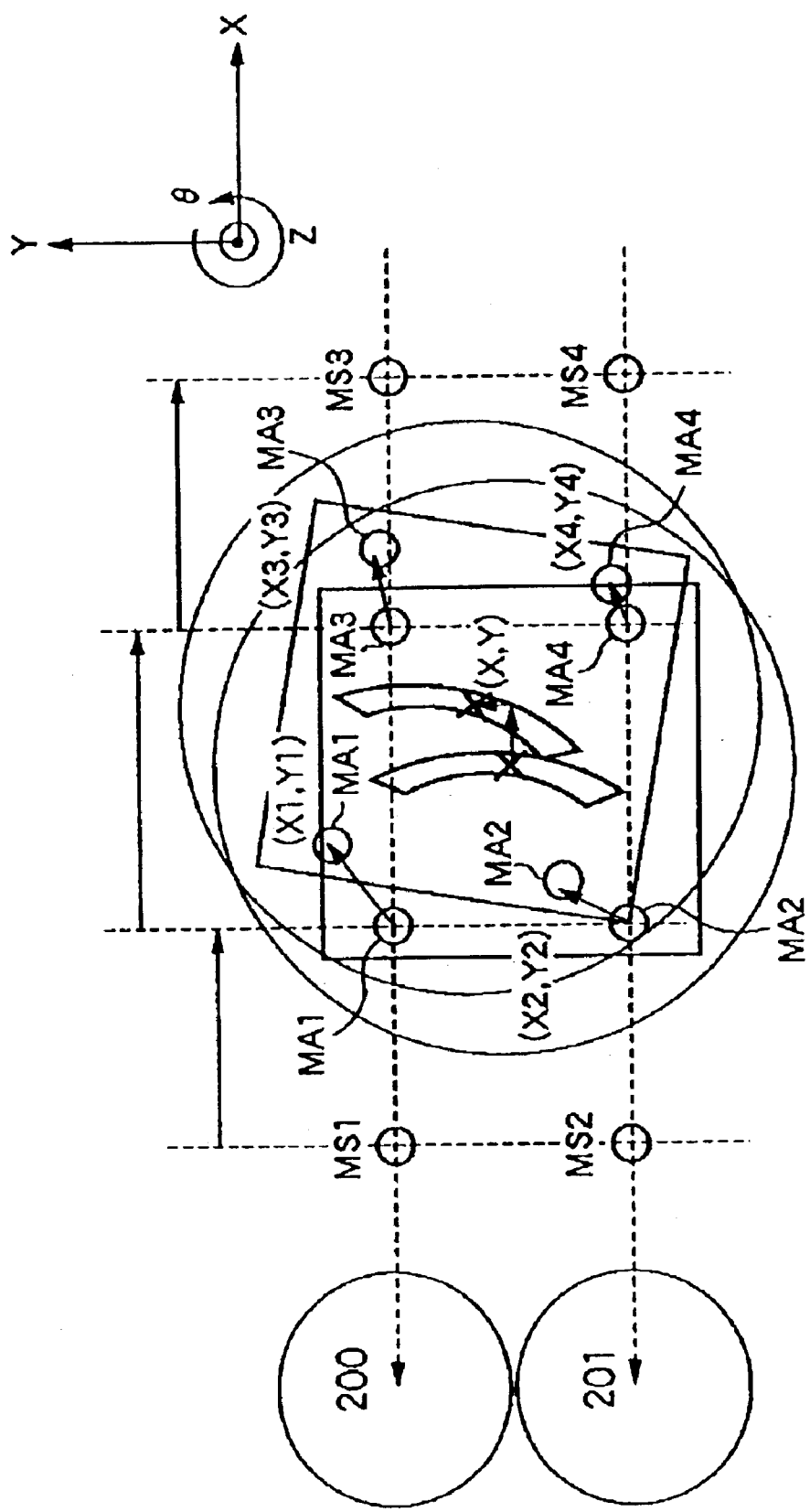
FIG. 2 is a diagram useful in describing reticle alignment processing according to the present invention.

FIG. 2 is a plan view illustrating EUV reticle alignment in which placement of the reference marks is seen from the Z direction. First, two or more reticle-stage reference marks are placed on the reticle stage 6. Further, two or more reticle alignment marks on the reticle 1 are placed in an area away from the exposure area. For example, the reticle-stage reference marks are represented by MS1 to MS4, and the reticle alignment marks are represented by MA1 to MA 4.

Furthermore, image sensing devices 200, 201 in FIG. 2 are placed at locations that have been positioned accurately in the apparatus proper. While the reticle stage is scanned in the negative direction along the X axis, deviation of the reticle alignment marks with respect to the reticle-stage reference marks, namely deviation of the reticle, can be calculated from the amounts of positional deviation of the marks whose images have been formed on the image sensing devices 200, 201. More specifically, the reticle stage 6 is scanned in the negative direction along the X axis and the reticle-stage reference marks MS1, MS2 on the reticle stage are detected using the image sensing devices 200, 201. This detection method obtains the currently prevailing amounts of deviation from the centers of the image sensing devices 200, 201 using bright-field image processing.

Next, if the reticle 1 has been placed on the reticle stage in accordance with design values, the reticle stage is scanned in the negative direction along the X axis in such a manner that the reticle alignment marks MA1 to MA 4 will arrive directly below the image sensing devices 200, 201, and bright-field image processing is used to find positional deviation amounts (X1, Y1) to (X4, Y4) of the reticle alignment marks MA1 to MA4 and positional deviation amounts of the reticle-stage reference marks MS3, MS4 whose images have been formed on the image sensing devices 200, 201. Finally, deviation of the reticle alignment marks with respect to the reticle-stage reference marks, namely, the amount of deviation of the reticle, is calculated. This deviation is added to an alignment control variable as deviation from a case wherein the reticle has been disposed on the reticle stage normally when the reticle and wafer are aligned utilizing the reticle-stage reference marks and wafer-stage reference marks, as will be described later. An arrangement may be adopted in which a correction is applied by utilizing this deviation to displace the reticle stage so as to place the reticle at the position of the design values or to re-position the reticle on the reticle stage (using a reticle transport mechanism, which is not shown) to obtain the stipulated layout.

Figure 3:
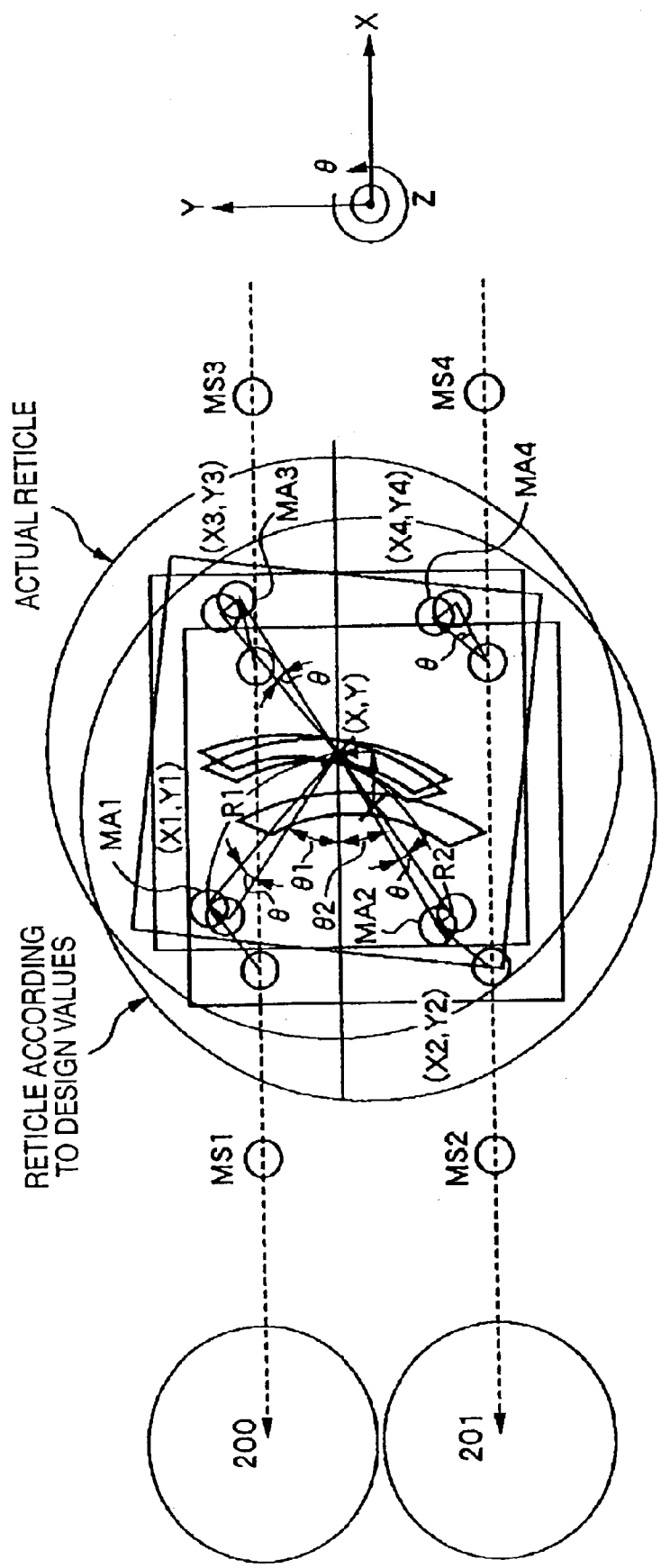
FIG. 3 is a diagram useful in describing reticle alignment processing according to the present invention.

FIG. 3 is a diagram useful in describing a specific reticle alignment operation in the positioning apparatus of the present invention. In order to execute alignment, any two points are selected as reference marks and a geometric positional relationship between these reference marks and the image sensing devices 200, 201, is calculated. Let the amounts of positional deviation of selected reticle alignment marks MA1 and MA2 be (X1, Y1) and (X2, Y2), respectively. If reticle deviation amounts (X, Y, θ) are calculated using the positional deviation amounts of the reticle alignment marks MA1, MA2, the operations are as follows:

$$X_1 = X + R_1 \theta \sin \theta_1 \quad (2)$$

$$Y_1 = Y + R_1 \theta \cos \theta_1$$

$$X_2 = X - R_2 \theta \sin \theta_2 \quad (3)$$

$$Y_2 = Y + R_2 \theta \cos \theta_2$$

From these equations, we obtain the following:

$$X = \frac{R_2 \sin\theta_2 X_1 + R_1 \sin\theta_1 X_2}{R_1 \sin\theta_1 + R_2 \sin\theta_2} \quad (4)$$

$$\theta = \frac{X_1 - X_2}{R_1 \sin\theta_1 + R_2 \sin\theta_2} \quad (5)$$

$$Y = \frac{R_2 \cos\theta_2 Y_1 + R_1 \cos\theta_1 Y_2}{R_2 \cos\theta_2 + R_1 \cos\theta_1} \quad (6)$$

In order to calculate the reticle deviation amounts (X, Y, θ), it suffices to make the calculation if two measurement points lie in a plane. However, it is also possible to calculate the reticle deviation amounts (X, Y, θ) by sensing the amounts of positional deviation of, e.g., the reticle alignment marks MA3, MA4 in the form of images using the image sensing devices and calculating the positional deviation amounts (X3, Y3), (X4, Y4). Further, statistical processing is possible by multiple-point measurement, as in this embodiment. Advantageous effects can be achieved, such as an averaging effect.

<Second Embodiment>

Figure 4:
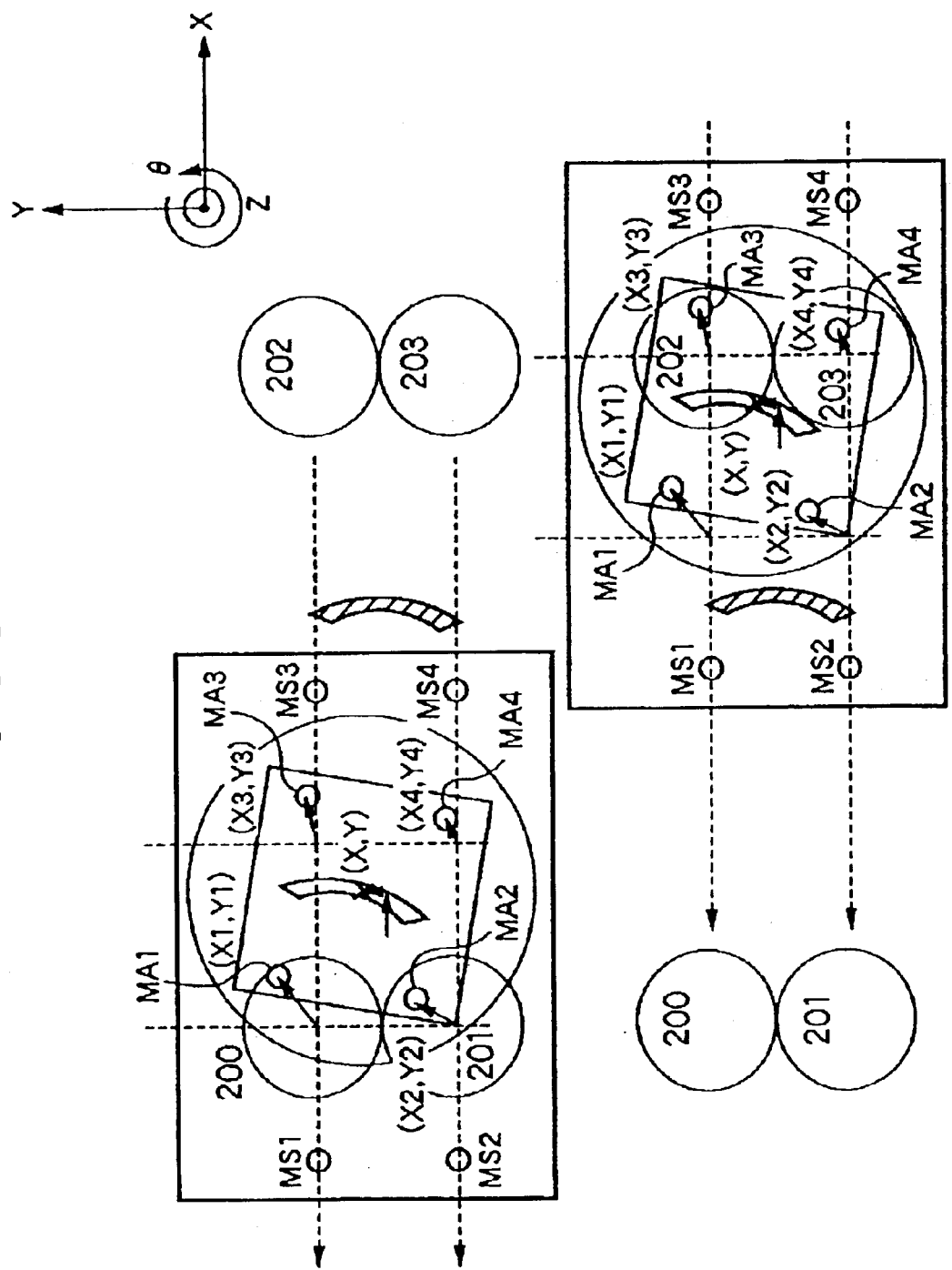
FIG. 4 is a diagram useful in describing a second embodiment of the present invention.

FIG. 4 is a diagram useful in describing a second embodiment of an alignment apparatus and method according to the present invention. Whereas FIG. 2 illustrates an arrangement in which two image sensing devices 200, 201 are disposed in the negative direction along the X axis, there is no limitation on the placement of the image sensing devices in this embodiment; image sensing devices 202, 203 may also be placed in the positive direction along the X axis, as depicted in FIG. 4. When the reticle stage is scanned in the negative direction along the X axis, the image sensing devices 200, 201 can be used to detect the reticle-stage reference marks MS1, MS2 and reticle alignment marks MA1, MA2. When the reticle stage is scanned in the positive direction along the X axis, the image sensing devices 202, 203 can be used to detect the reticle-stage reference marks MS3, MS4 and reticle alignment marks MA3, MA4. As a result, alignment detection is possible using only a scanning area necessary for the reticle stage to be exposed to EUV light, error due to unnecessary scanning of the reticle stage is reduced and precision can be improved further.

Figure 9:
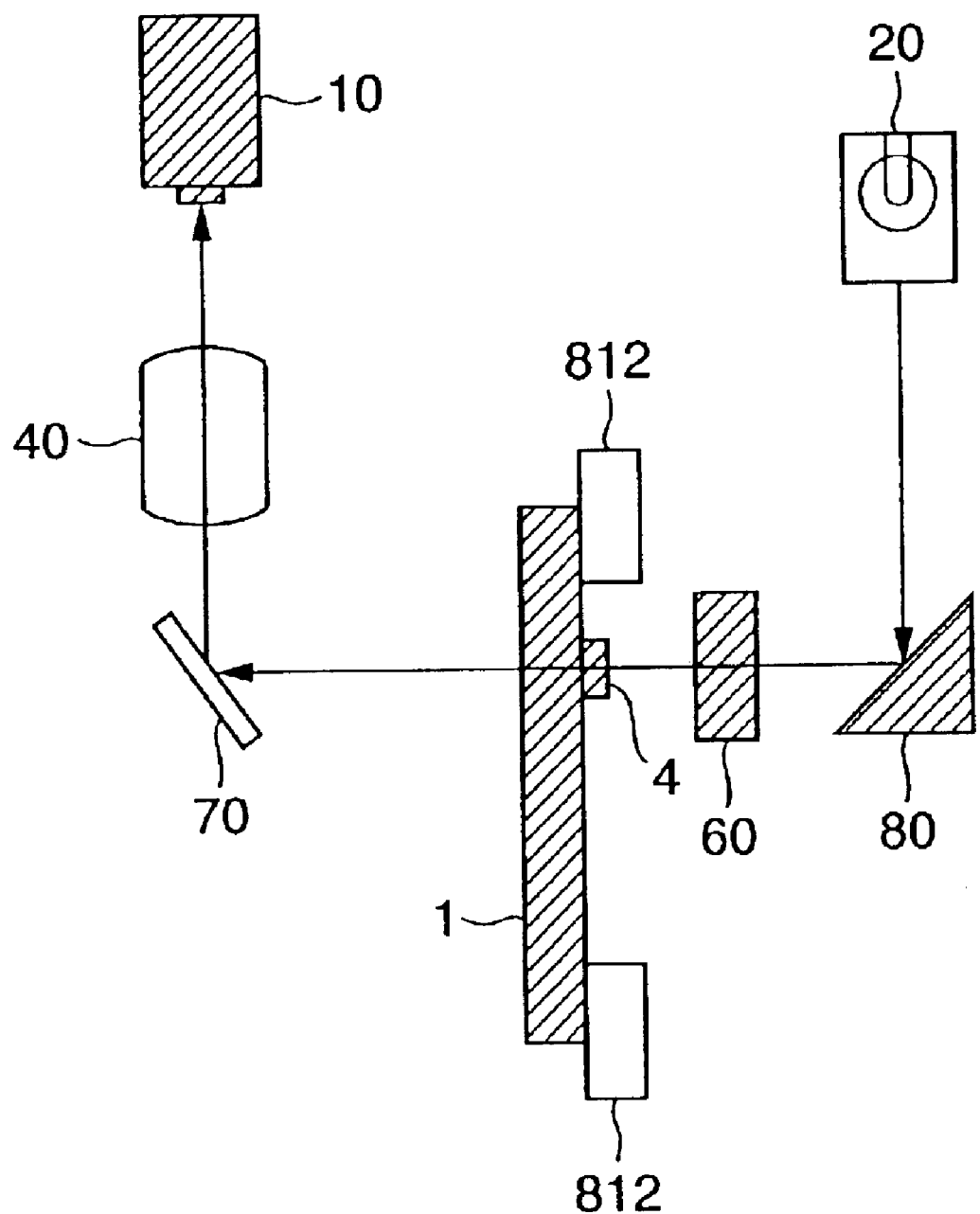
FIG. 9 is a diagram showing reticle alignment according to the prior art.

With conventional reticle alignment, as shown in FIG. 9, making the gap between the reticle reference mark 60 and reticle alignment mark 4 too large is undesirable for reasons of precision. With reticle alignment according to the first and second embodiments, however, the working distance between the deflecting mirror 50 and reticle-stage reference mark 2 may be chosen freely. This affords greater freedom of design with regard to the pellicle on the reticle.

<Third Embodiment>

Figure 5:
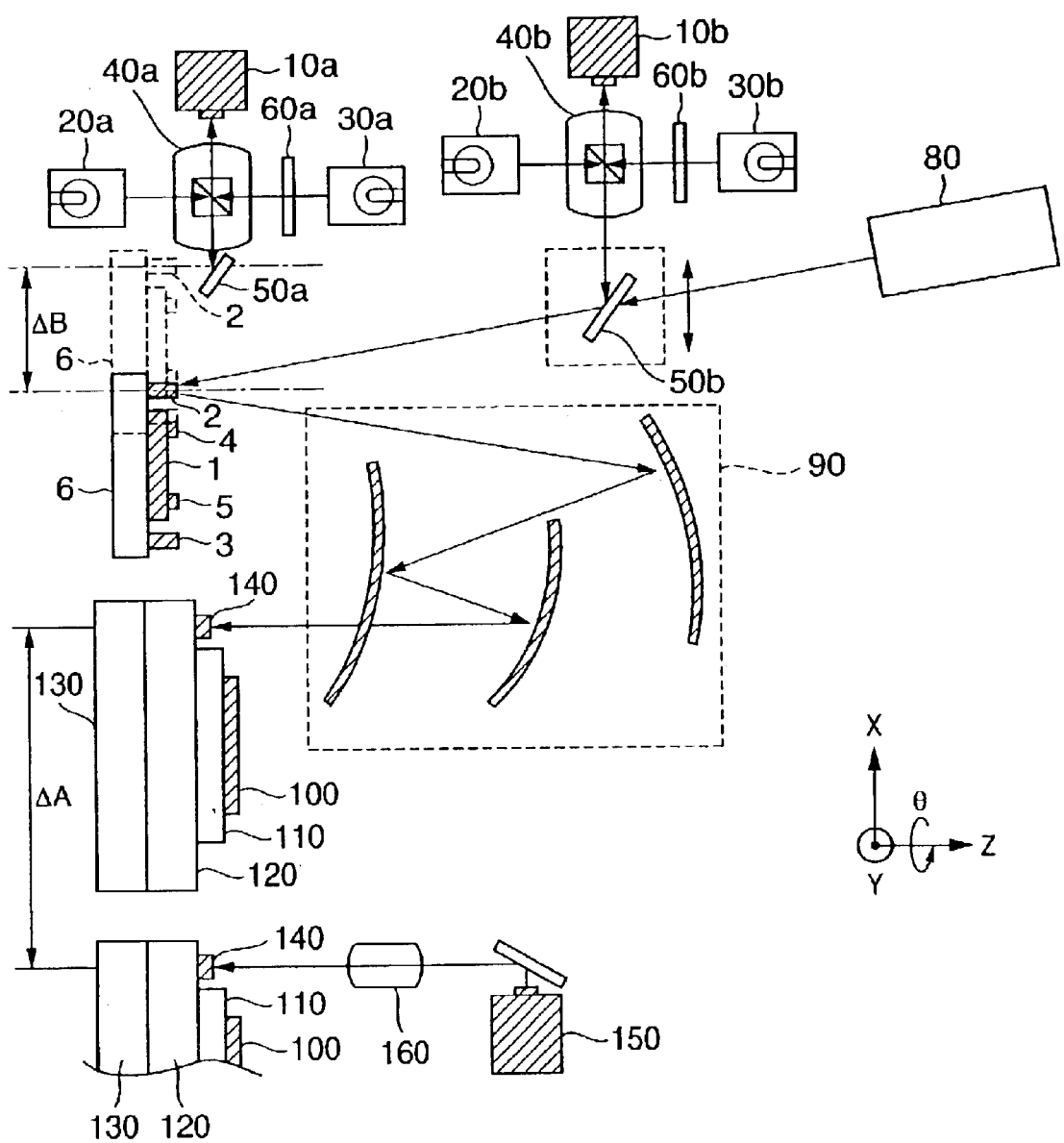
FIG. 5 is a diagram showing an arrangement in a case where an alignment apparatus is applied to an EUV exposure apparatus.

FIG. 5 is a diagram illustrating the structure of an exposure apparatus that includes an alignment device and is useful in describing a third embodiment. Image sensing devices 10a, 10b, illumination sources 20a, 20b, illumination sources 30a, 30b, optical systems 40a, 40b, a deflecting mirror 50a and reticle reference marks 60a, 60b are members corresponding to the above-described image sensing device 10, illumination source 20, illumination source 30, optical system 40, deflecting mirror 50 and reticle reference mark 60, respectively. The apparatus further includes a wafer chuck 110 for holding a wafer 100, a θZ tilt stage 120 and an XY stage 130. While the wafer 100 is illuminated with EUV light, which is exposing light from an illumination system 80, via the reticle 1 and a reflecting-mirror optical system 90, the reticle stage 6 and XY stage 130 (the θZ tilt stage 120 also is used) are scanned synchronously, whereby the wafer 100 is exposed to the pattern on the reticle 1 by scanning projection. Alignment light, which is non-exposing light, is emitted from the illumination source 20b. The non-exposing light is reflected by a mirror 50b, thereby illuminating the reticle-stage reference mark 2. Furthermore, the alignment light reflected by the reticle-stage reference mark 2 passes through the reflecting-mirror optical system 90 and illuminates a stage reference mark 140 on the wafer stage.

Alignment light reflected by the stage reference mark 140 passes through the reflecting-mirror optical system 90 again and is reflected by the reticle-stage reference mark 2, after which the light is reflected by the mirror 50b and directed toward the image sensing device 10b. The reticle and wafer are brought into alignment based upon the relative positional relationship between the detected stage reference mark 140 and reticle-stage reference mark 2. (In this specification, this is covered by the definition of on-axis TTL alignment.)

Here, the relative positional relationship between the reticle 1 and the reticle-stage reference mark 2 is detected beforehand by the method described in the first embodiment. With regard to the positional relationship between the two, it is assumed that alignment has been performed accurately or that the state of deviation has been ascertained correctly.

Next, in similar fashion, the relative positional relationship between the stage reference mark 140 and a wafer alignment mark (not shown) on the wafer 100 is detected separately by an off-axis method using an off-axis scope in which image sensing is performed by the image sensing device 150 via the optical system 160, and alignment is performed or the state of deviation ascertained.

Next, the distance (baseline), which corresponds to ΔA in FIG. 5, between the exposure axis and off-axis detection system is found using a well-known baseline measurement method. More specifically, and by way of example, ΔA can be calculated accurately from the position of the stage reference mark 140 detected by the non-exposing alignment light emitted from the illumination source 20b, the position of the stage reference mark 140 detected using the off-axis microscope, and the stage travelling distance between the detected positions.

Furthermore, in this embodiment, reticle alignment also is performed at a location offset from the exposure axis and, hence, there is a distance, which corresponds to ΔB in FIG. 5, between the exposure axis and the reticle alignment detection system. This is defined as the baseline on the reticle side. The baseline ΔB on the reticle side can also be detected accurately in a manner similar to that of ordinary baseline calculation by detecting the position of the reticle-stage reference mark 2 using non-exposing alignment light emitted from the illumination source 20b and detecting this position by the detection system described in the first embodiment.

In this embodiment, off-axis TTL alignment is carried out and baselines on the sides of the reticle and wafer are corrected, whereby the alignment relationship among the exposure axis and the off-axis detection systems on the reticle and wafer sides is determined. Accordingly, if the positional relationship between the reticle-stage reference mark and the reticle alignment mark is detected by the method of the first embodiment whenever the reticle is changed or periodically, and the positional relationship between the stage reference mark and wafer alignment mark is detected by the above-mentioned off-axis scope whenever the wafer is changed, then, upon subsequently adding all of these mutual interrelationships together, the reticle 1 and wafer 100 can be aligned by performing so-called off-axis global alignment, in which relative alignment is executed by relying upon the precision of stage movement using as a reference the positions of the reticle-stage reference mark 2 and stage reference mark 140 obtained by each of the off-axis systems. In this case, it will suffice to use on-axis TTL alignment only for checking the baselines. Moreover, in the above description, though the reticle alignment mark and the reticle reference mark are also used as the reflected type, even if it is the case wherein at least one side is a transmitted type, the baseline ΔB can also be detected by the similar method.

In this embodiment, through a technique different from the above, the positional relationship between the reticle-stage reference mark and reticle alignment mark can be detected by the method of the first embodiment whenever the reticle is changed or periodically, and the positional relationship between the stage reference mark and wafer alignment mark can be detected by the above-mentioned off-axis scope whenever the wafer is changed, and then on-axis TTL alignment can be performed each time wafer exposure is performed. In this case, relative alignment (global alignment) that relies upon the precision of stage movement can be executed based upon the result of position detection by on-axis TTL. Baseline measurement is not required. It should be noted that the mirror 50b has a moving mechanism so that it will not block the EUV exposing light emitted from the illumination system 80. Further, it is particularly desirable to adopt an arrangement in which a plurality of wafer alignment marks and a plurality of stage reference marks are also provided on the reticle side in similar fashion and are detected by respective ones of a plurality of off-axis scopes.

In accordance with this embodiment, as shown in FIG. 5, the reference on the reticle side necessary for on-axis TTL alignment can be shifted from the reticle alignment mark, for which reflectivity, i.e., mark contrast, is poor with non-exposing light, to the reticle-stage reference mark. As a result, on-axis TTL alignment can be carried out using a reticle-stage reference mark for which reflectivity (mark contrast) is optimized with respect to alignment light, and alignment precision therefore is improved. In particular, according to this embodiment, the light source for detecting the reticle-stage reference mark and stage reference mark via the reflecting-mirror optical system, the light source for detecting the reticle-stage reference mark and reticle alignment mark, and the light source for detecting the stage reference mark and wafer alignment mark are separate light sources. As a result, the wavelength of light suited to on-axis TTL alignment and the wavelengths of light suited to detection of the reticle mark and detection of the wafer mark can be selected separately.

<Fourth Embodiment>

Figure 6:
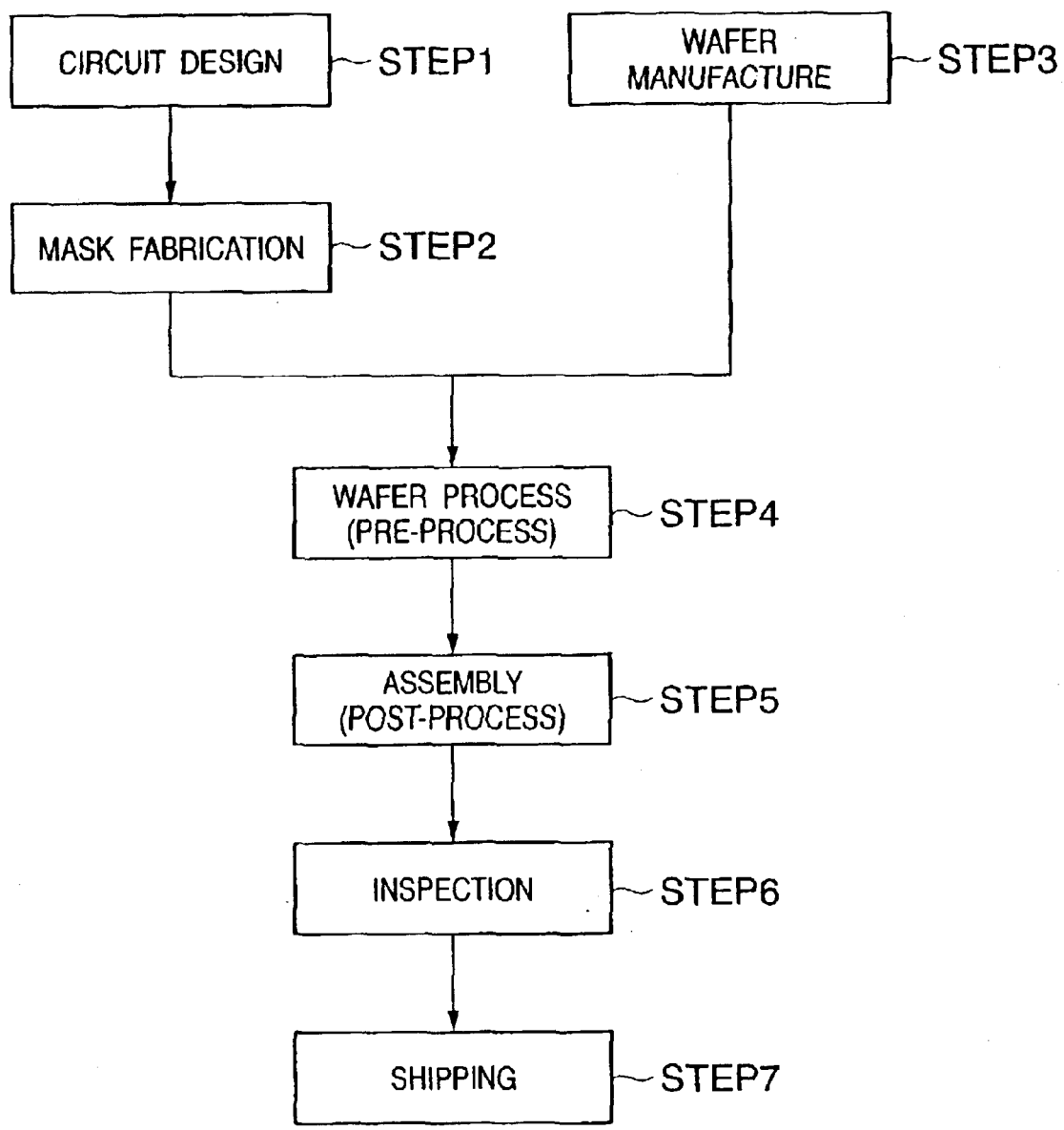
FIG. 6 is a diagram useful in describing the flow of a device manufacturing process.

Described next will be an embodiment of a method of manufacturing a device utilizing the exposure apparatus set forth above. FIG. 6 is a flowchart illustrating the manufacture of a microdevice (e.g., a semiconductor chip such as an IC or LSI, a liquid crystal panel, a CCD, a thin-film magnetic head, a micromachine, etc.).

The circuit for the device is designed at step 1 (circuit design). A mask on which the designed circuit pattern has been formed is fabricated at step 2 (mask fabrication). Meanwhile, a wafer is manufactured using a material such as silicon or glass at step 3 (wafer manufacture). The actual circuit is formed on the wafer by lithography, using the mask and wafer that have been prepared, at step 4 (wafer process), which is also referred to as "pre-treatment". A semiconductor chip is obtained, using the wafer fabricated at step 4, at step 5 (assembly), which is also referred to as "post-treatment". This step includes steps such as actual assembly (dicing and bonding) and packaging (chip encapsulation). The semiconductor device fabricated at step 5 is subjected to inspections such as an operation verification test and a durability test, at step 6 (inspection). The semiconductor device is completed through these steps and then is shipped (step 7).

Figure 7:
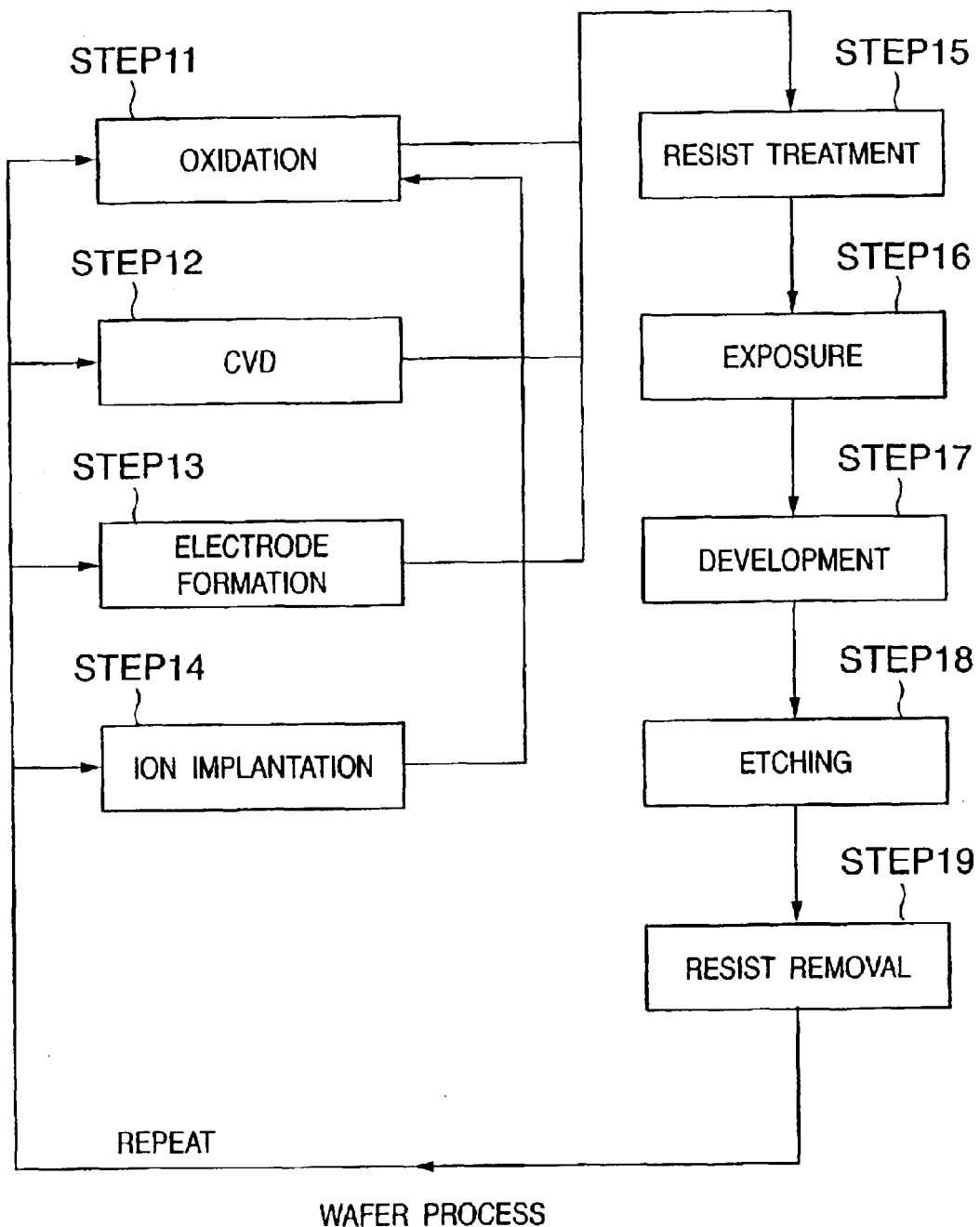
FIG. 7 is a diagram useful in describing the details of a wafer process.
Figure 8:
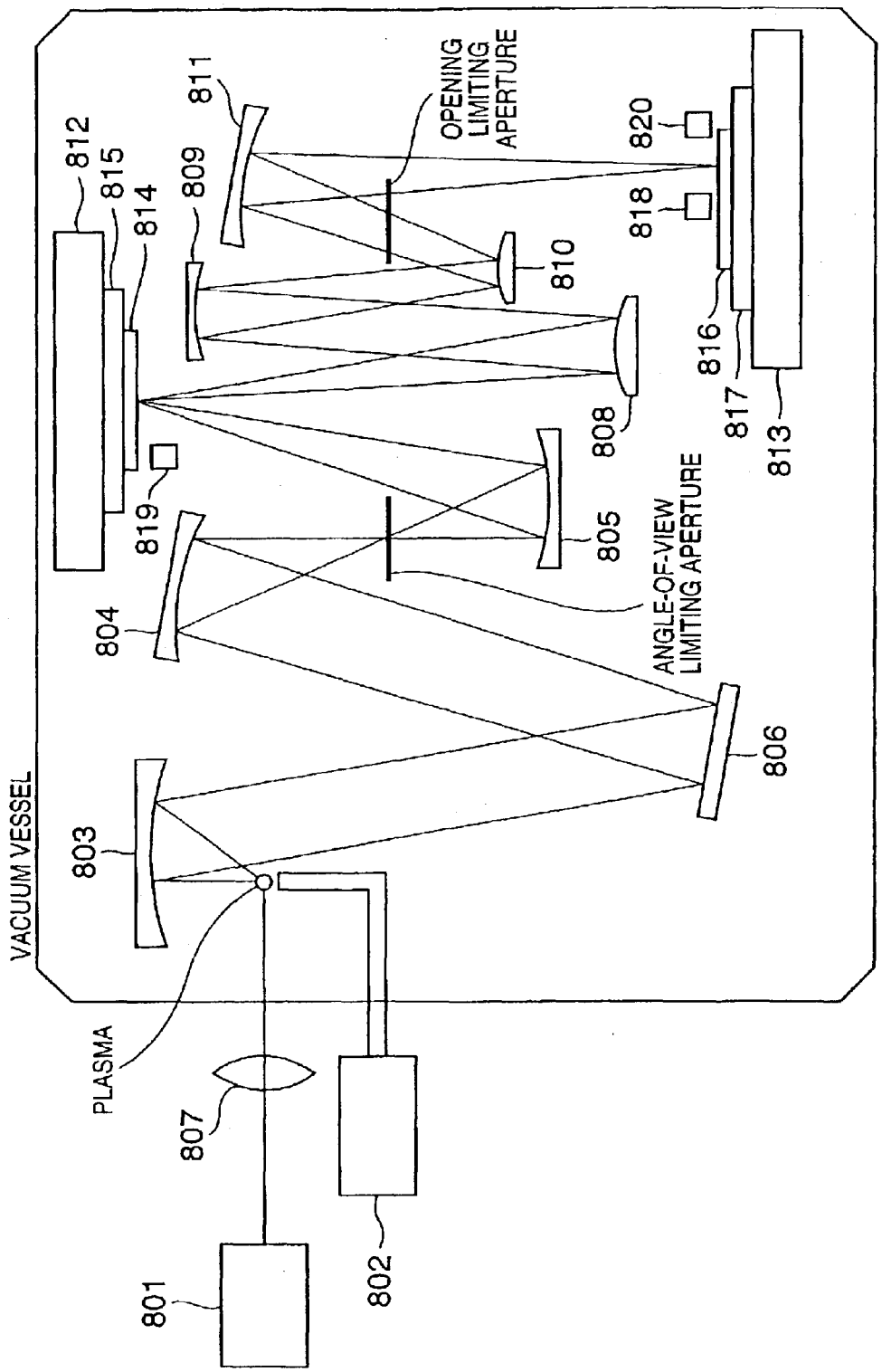
FIG. 8 is a diagram showing the structure of an EUV exposure apparatus according to the prior art.

FIG. 7 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly.

If the manufacturing method of this embodiment is used, it will be possible to manufacture semiconductor devices having a high degree of integration. Such devices have been difficult to manufacture heretofore.

In accordance with the present invention, as described above, reticle alignment can be achieved using the reticle stage as a reference. This makes possible alignment that is not affected by the reflectivity of the reticle.

Further, in accordance with the present invention, the reference on the reticle side necessary for on-axis TTL alignment can be shifted from the reticle alignment mark to the reticle-stage reference mark. As a result, on-axis TTL alignment can be carried out using a reticle-stage reference mark for which reflectivity is optimized with respect to alignment light, and alignment precision, therefore, is improved.

In accordance with the present invention in a separate aspect, alignment can be executed accurately and rapidly based upon a reference mark provided on a stage even in a case where use is made of a reticle involving limitations with regard to use of alignment light, such as a reflecting-type reticle.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for performing exposure using exposure light, said apparatus employing a reticle holding mechanism for holding a reticle, a substrate holding mechanism for holding a substrate to be exposed, and a projection optical system for projecting a pattern of the reticle onto the substrate to thereby expose the substrate to the pattern, said exposure apparatus comprising:

a first position detection unit for detecting a position reference of said reticle holding mechanism;

a second position detection unit for detecting a position reference of said substrate holding mechanism; and a third position detection unit for detecting both the position reference of said reticle holding mechanism and the position reference of said substrate holding mechanism via said projection optical system, a baseline on the side of said reticle holding mechanism being found from results of detection by said first and third position detection units, a baseline on the side of said substrate holding mechanism being found from results of detection by said second and third position detection units, and relative positions of said reticle holding mechanism and said substrate holding mechanism being controlled using said first and second position detection units upon taking both of said baselines into consideration.

2. An exposure apparatus according to claim 1, wherein the first position detection unit detects a relative positional relationship between the position reference of said reticle holding mechanism and a reticle alignment mark, the second position detection unit detects a relative positional relationship between the position reference of said substrate holding mechanism and a substrate alignment mark, and wherein relative alignment between the reticle and substrate is executed based upon both of the relative positional relationships obtained.

3. An exposure apparatus according to claim 1, wherein the reticle is a reflective reticle.

4. An exposure apparatus according to claim 1, wherein the position reference of said reticle holding mechanism is a reticle reference mark provided on the reticle stage, and wherein the reticle reference mark is a reflective reticle.

5. An exposure apparatus according to claim 1, wherein X rays are adopted as the exposure light.

6. A method of manufacturing a device, having:

a step of exposing a substrate using an exposure apparatus according to claim 1; and a step of developing the substrate.

* * * * *